United States Patent [19]

Achtstaetter

[11] 4,303,891

[45] Dec. 1, 1981

[54] MONOLITHIC INTEGRATED CIRCUIT WITH FREQUENCY DEPENDENT AMPLIFICATION

[75] Inventor: Gerhard Achtstaetter, Gundelfingen, Fed. Rep. of Germany

[73] Assignee: ITT Industries, Inc., New York, N.Y.

[21] Appl. No.: 102,216

[22] Filed: Dec. 10, 1979

[30] Foreign Application Priority Data

Dec. 18, 1978 [DE] Fed. Rep. of Germany ....... 2854704

[51] Int. Cl.³ ............................................. H03F 3/45
[52] U.S. Cl. ..................................... 330/260; 330/294; 330/301

[58] Field of Search ............... 330/117, 148, 260, 294, 330/295, 275, 301, 307, 311

[56] References Cited

U.S. PATENT DOCUMENTS 3,247,462  4/1966  Kobbe ............................ 330/117 X Primary Examiner—James B. Mullins
Attorney, Agent, or Firm—John T. O'Halloran; Peter C. Van Der Sluys

[57] ABSTRACT

A sound amplifier is provided in a monolithic integrated circuit form and includes tone compensated volume control achieved by the use of emitter followers and a capacitor connected at one side to ground.

2 Claims, 3 Drawing Figures

MONOLITHIC INTEGRATED CIRCUIT WITH FREQUENCY DEPENDENT AMPLIFICATION

BACKGROUND OF THE INVENTION

1. Field of the Invention

The invention relates to sound amplifiers and, more particularly, to such amplifiers having tone volume compensation.

2. Description of the Prior Art

Circuits with an amplification increasing as the frequency decreases can be used in 1f-amplifiers for effecting the frequency-dependent peaking in the case of low frequencies, especially in cases where the physiological frequency-dependent loudness perception of the human ear is to be compensated for by a corresponding oppositely oriented frequency dependence of the 1f-amplifier.

From the German Offenlegungsschrift (DE-OS) No. 27 15 981, especially from FIG. 4 thereof, there is known a bass boosting integrated circuit in which a transistor is used which is operated as an emitter follower, with this transistor indicated therein by the reference numeral 88. The base of this transistor is grounded with respect to a.c. voltage via a capacitor applied to the zero point of the circuit (ground).

Considerations and investigations of the inventor have shown that this conventional circuit only very insufficiently meets the intended purpose of a bass boosting.

SUMMARY OF THE INVENTION

It is the object of the invention to provide an improved type of functionable bass boosting circuit which is likewise without further ado capable of being realized in the form of a monolithic integrated circuit, that is, in which the capacitor determinative of the frequency response, can likewise be connected with one side to the zero point of the circuit. In addition thereto, the circuit is required to be extendable in a simple way to form a complete acoustically compensated circuit.

DESCRIPTION OF THE INVENTION

Figure 1:
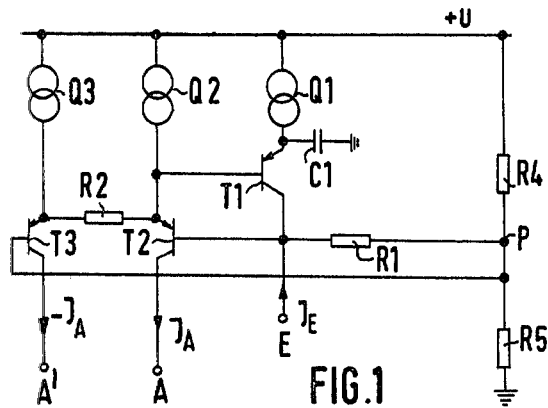
FIG. 1 shows a circuit diagram relating to one type of embodiment of the invention.

The example of embodiment according to FIG. 1 shows three transistors T1, T2, T3 which are operated as emitter followers, and whose respective emitter resistance is marked with the symbol for a constant current source Q1, Q2, Q3. Of course, it is also possible to provide an ohmic resistor for serving as the respective constant current source. The emitter of the first transistor T1 is applied via the capacitor C1 to the zero point of the circuit. This capacitor is determinative of the frequency behavior of the circuit. The collector of the first transistor T1 is applied across the first resistor R1, to a point P of constant potential which, in the example of embodiment as shown in FIG. 1, is realized by the tapping point of the voltage divider consisting of the resistors R4, R5 and which, in turn, is applied to the supply voltage +U.

Moreover, the collector of the first transistor T1 is still applied to the base of the second transistor T2 whose emitter is directly connected to the base of the first transistor T1 and, across the second resistor R2 is applied to the emitter of the third transistor T3. The base of this transistor is likewise applied to point P of constant potential.

The input E is constituted by the common connecting point of the collector of the first transistor T1, the base of the second transistor T2, and the first resistor R1. As the output A,A' there is used one of the collectors of the second and of the third transistor T2, T3, or both of these collectors.

When a signal current $I_E$ is applied to the input E, the voltage drop across the resistor R1 produces a signal voltage which, with a low-ohmic internal resistance, again appears at the emitter of the second transistor T2, thus driving the first transistor T1 into saturation. The total voltage gain of the arrangement consisting of the transistors T1, T2 is equal to the quotient of both the resistance value R1 and the frequency-dependent resistance of the capacitor C1; it increases as the signal frequency increases. On the other hand, the signal at the collector of the first transistor T1 is directed in opposition to the input signal and thus effects a weakening of the total signal. The relationship of the second to the first resistor R2/R1 is determinative of an additional linear amplification. The circuit can be dimensioned in such a way that, for example, a signal reduction is not yet effected at 20 Hz, but that the signal is already reduced by 20 dB at a frequency of 300 Hz. Accordingly, the output signal may thus be fed into other parts of the circuit for achieving an adjustable bass boosting/-lowering.

Figure 2:
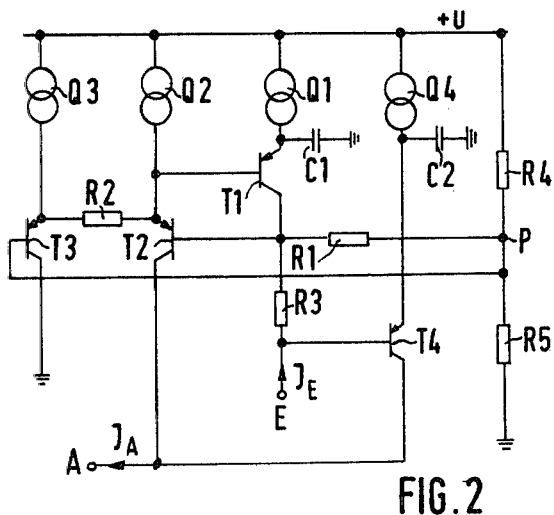
FIG. 2 shows the circuit diagram relating to a further embodiment of the invention for effecting a bass and treble boost.

A preferred field of practical application of the invention is seen in the already mentioned physiological bass and treble boosting. For effecting a treble boosting, it is necessary to enlarge the circuit in the way as shown in the diagram of FIG. 2. For the treble boosting purpose there is provided the fourth transistor T4 which is likewise operated as an emitted follower, with the emitter thereof being applied via the further capacitor C2 to the zero point of the circuit, and comprises the constant current source Q4 for serving as the operating resistor. The point connecting the base of the second transistor T2 to the collector of the first transistor T1 and to the first resistor R1 is applied across the third resistor R3, to the signal input E to which there is also applied the base of the fourth transistor T4. The collector of the fourth transistor T4 is connected to the collector of the second transistor T2 and forms the only output A in this example of embodiment, because the collector of the third transistor T3 is connected to the zero point of the circuit. The mode of operation of the fourth transistor T4 and of the second capacitor C2 (emitter follower comprising an emitter applied to ground via the capacitor C2) is known per se from FIG. 2 of the aforementioned German Offenlegungsschrift (DE-OS) No. 27 15 981, relating to a treble boosting, and no independent protection is claimed for this within the scope of the present invention.

Figure 3:
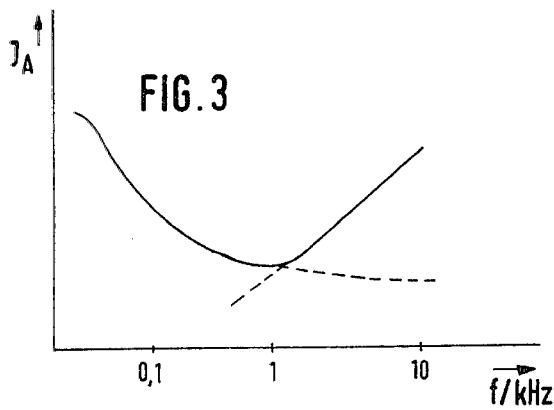
FIG. 3 shows the output current frequency characteristic of the circuit according to FIG. 2.

At high frequencies, a constant signal is produced across the third resistor R3. The collector current of the fourth transistor T4 increases in dependence upon the frequency dependent conductance of the further capacitor C2 and reaches at about 1 kHz a value which becomes noticeable in the sum current $I_4$ as compared with the collector current of the second transistor T2. The characteristic of the output current $I_4$ is shown in principle in FIG. 3. This output current, as in the example of embodiment shown in FIG. 1, may be fed into other parts of the circuit for serving the tone-compensated volume control of sound amplifiers.

In the examples of embodiment shown in FIGS. 1 and 2, the transistors T1 . . . T4 are all shown to be of the same conductivity type and operated as PNP-transistors, with the respective emitters thereof being in connection with the positive supply voltage +U. Of course, it is also possible to use NPN-type transistors, with the emitters thereof then having to be in connection with a voltage which is negative with respect to the potential of the zero point of the circuit (ground).

What is claimed is:

1. A monolithic integrated circuit with frequency dependent amplification, employing a first transistor operated as an emitter follower, and a capacitor applied with one side to the zero point of the circuit, wherein the improvement comprises:

the capacitor being connected between the emitter of the first transistor which is operated as an emitter follower and the zero point of the circuit;

a first resistor connecting the collector of the first transistor to a point of constant potential;

the collector of the first transistor being applied to the base of a second transistor operated as an emitter follower, with the emitter thereof being connected to the base of the first transistor;

the emitter of a third transistor operated as an emitter follower, being connected across a second resistor to the emitter of said second transistor;

the base of said third transistor being applied to the point of constant potential; and a signal input at the base of the second transistor, and a signal output being the collector of one of said second and third transistors, whereby amplification of bass frequencies is increased.

2. Circuit as claimed in claim 1, additionally comprising:

a further capacitor connecting the emitter of a fourth transistor operated as an emitter follower, to the zero point of the circuit, with the collector thereof being applied to the collector of said second transistor;

the common connecting point of the base of said second and the collector of said first transistor as well as of said first resistor is applied across a third resistor to said signal input and to the base of said fourth transistor;

the collector of said third transistor is applied to the zero point of the circuit; and the collectors connected together of both said second and the fourth transistor serve as the signal output whereby amplification of treble frequencies is increased.

* * * * *